United States Patent [19]

Gupta et al.

[11] Patent Number: 4,752,946

[45] Date of Patent: Jun. 21, 1988

[54] GAS DISCHARGE DERIVED ANNULAR PLASMA PINCH X-RAY SOURCE

[75] Inventors: Rajendra P. Gupta, Gloucester; Mladen M. Kekez, Ottawa; John H. Lau; Gary D. Lougheed, both of Gloucester, all of Canada

[73] Assignee: Canadian Patents and Development Ltd., Ottawa, Canada

[21] Appl. No.: 910,536

[22] Filed: Sep. 23, 1986

[30] Foreign Application Priority Data

Oct. 3, 1985 [CA] Canada .................................. 492226

[51] Int. Cl.$^4$ ........................................... H01J 35/00
[52] U.S. Cl. .................................. 378/119; 378/121; 378/122
[58] Field of Search ........................ 378/119, 122, 121

[56] References Cited

U.S. PATENT DOCUMENTS

| | | | |
|---|---|---|---|
| 4,184,078 | 1/1980 | Nagel et al. | 250/492 A |
| 4,201,921 | 5/1980 | McCorkle | 378/122 |
| 4,504,964 | 3/1985 | Cartz et al. | 378/119 |
| 4,536,884 | 8/1985 | Weiss et al. | 378/119 |
| 4,538,291 | 8/1985 | Iwamåtsu | 378/119 |
| 4,602,376 | 7/1986 | Doucet et al. | 378/119 |
| 4,618,971 | 10/1986 | Weiss et al. | 378/119 |
| 4,633,492 | 12/1986 | Weiss et al. | 378/119 |

OTHER PUBLICATIONS

H. A. Hyman et al, Intense-Pulsed Plasma X-Ray Sources for Lithography: Mask Damage Effects, J. Vac. Sci. Technol., 21(4), Nov./Dec. 1982, pp. 1012-1016.
S. M. Matthews et al, Plasma Sources for X-Ray Lithography, SPIE, vol. 333, Submicron Lithography (1982), pp. 136-139.

Primary Examiner—Janice A. Howell
Assistant Examiner—David P. Porta
Attorney, Agent, or Firm—Yoshiharu Toyooka

[57] ABSTRACT

This invention describes a pulsed plasma pinch x-ray source. In the device the initial plasma annulus is derived from an electrical gas discharge in a chamber having constricted openings arranged on a circle. This low mass plasma annulus is imploded and pinched by passing high current axially through said annulus. The hot and dense pinched plasma copiously emits x-rays and has the capability of being fired at high repetition rates. The device is simple for commercial applications, such as x-ray lithography.

16 Claims, 1 Drawing Sheet

GAS DISCHARGE DERIVED ANNULAR PLASMA PINCH X-RAY SOURCE

TECHNICAL FIELD

The invention relates to an x-ray source suitable for commercial submicron lithography on semiconductors for making dense large scale integrated circuits.

BACKGROUND OF THE INVENTION

The invention relates to making an x-ray source suitable for submicron lithography of semiconductors in commercial quantities. The technical specification of such a source can be drived from a research paper "Intense Pulsed Plasma X-Ray Source for Lithography: Mask Damage Effects" published by H.A. Hyman et al. in the Journal of Vacuum Science Vol. 21, pp. 1012–1016 (1982). Essentially it requires, in order to avoid mask thermal damage, a source with small size, high conversion efficiency of electrical energy into x-rays about 1 keV and x-ray emission during the required exposure time to be continuous for distributed over several small pulses rather than concentrated in one strong pulse.

The most common x-ray source is the electron impact type source in which electrons are accelerated by an electric field to impinge on a metal target. The electrical to x-ray energy conversion efficiency of such a source is so low that heat dissipation in an acceptable lithography source presents an insurmountable problem.

In another type of x-ray source, as shown by Nagel et al. U.S. Pat. No. 4,184,078, Jan. 15, 1980, a high power pulsed laser beam strikes a solid target to form a dense plasma which emits x-rays for a very short duration. The laser required for such a source is very bulky and expensive and not economical to operate at a repetition rate desired for commercial x-ray lithography.

In yet another type of x-ray source, a gas is puffed between a pair of electrodes to form an annulus, and a capacitor bank discharged between the electrodes through the gas annulus, which then carries high current and as a result implodes on its axis. The implosion, being driven by the energy stored in the capacitor bank, forms a hot and dense plasma column causing x-ray emission. The main limitation of the device is the low repetition rate due mainly to the time required to pump down the puffed gas. See for example "Plasma Sources for X-ray Lithography", S.M. Matthews et al, SPIE Volume 333, Submicron Lithography (1982) pp 136–139.

On yet another type of x-ray source, as shown by Cartz et al. U.S. Pat. No. 4,504,964, Mar. 12, 1985, high power pulsed laser beams are used to produce an annulus of material between two electrodes through which a high current is passed by discharging a capacitor bank. This causes the material to implode on the axis of the annulus, forming a dense hot plasma which is then a pulsed source of x-rays. The use of a high power laser makes the device bulky and very expensive.

There are other types of imploding plasma x-ray sources developed for research such as the exploding wire array and the thin foil annulus, but these require replacement of imploding material after each shot and thus are not usable for commercial x-ray lithography.

As has been shown by McCorkle U.S. Pat. No. 4,201,921, May 6, 1980, x-rays can be repeatedly produced by impinging an intense electron beam on a plasma generated by passing a high current along the inner wall of an insulator capillary. One of the problems with such a source is that the capillary needs to be replaced after sevral shots.

SUMMARY OF THE PRESENT INVENTION

The present invention provides a simple, low cost means of repeatedly producing intense x-ray such as for submicron lithography for making densely packed integrated circuits. The invention provides the formation of gas plasma annulus between a pair of electrodes by an electrical gas discharge in a chamber having constricted openings and x-ray generation by way of pinching said plasma by passing high current through it.

DETAILED DESCRIPTION OF THE PREFERRED EMBODIMENTS

Figure 1:
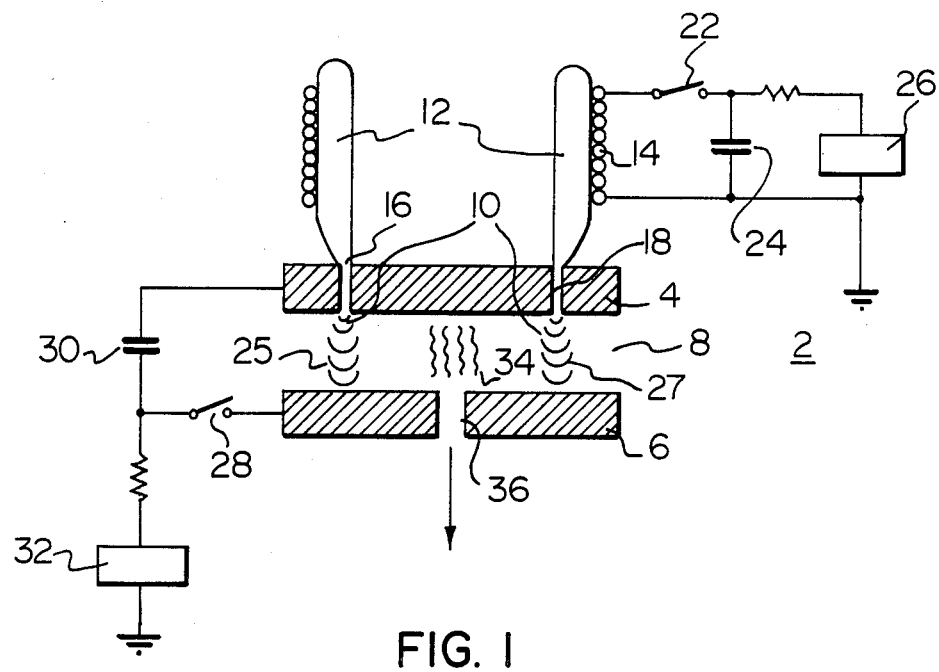
FIG. 1—is a schematic display of the x-ray device in accordance
with the invention.

The x-ray device 2 in FIG. 1 comprises a pair of circular electrodes 4 and 6 separated with a vacuum space 8. A plasma annulus 10 between electrodes 4 and 6 is formed when an electrical gas-discharge in the annular chamber 12 is induced by passing high current in coil 14 and the resulting high temperature and pressure in the gas creates plasma and forces the plasma through a multiplicity of openings, such as 16 and 18. The high current in coil 14 may be passed by closing switch 22 to discharge a capacitor 24 previously charged by a power supply 26. Plasma plumes such as 25 and 27 bridge the space 8 between the electrodes 4 and 6.

Once the plasma annulus is formed in space 8 between the electrodes 4 and 6, switch 28 is closed to discharge a capacitor 30 which is charged by a power supply 32. This causes high current to flow through the plasma annulus and the resulting high magnetic field implodes the plasma to form a pinch 34. The pinched plasma 34 is hot and dense enough to radiate x-rays. The x-rays for lithography and the like uses leave the device through axial passage such as 36. Alternately, the x-rays may be emitted out radially or at an angle through the electrodes by providing appropriate passages.

The plasma annulus may be made to implode on a material or plasma plume created at the axis of the device by a vacuum arc similar to 10 or by laser, gas puff or the like techniques.

In an alternate arrangement of the device the gas discharge in the annular chamber is created by passing current through the electrodes inserted in the chamber. In another arrangement the chamber is a hollow cylinder. In yet another arrangement the gas in the chamber is injected momentarily prior to discharge by opening a fast valve.

Figures 2, 3:
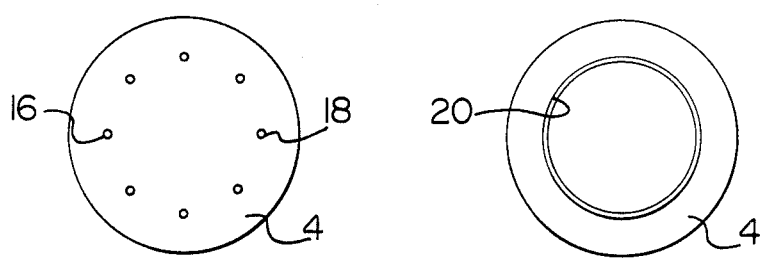
FIG. 2—is a schematic view of an embodiment for gas plasma injection
on the upper electrode shown in FIG. 1.
FIG. 3—is a schematic view of another embodiment plasma injection
on the electrode shown in FIG. 1.

FIGS. 2 and 3 show two embodiments of constricted openings provided in the chamber 12 shown in FIG. 1. In FIG. 2 a multiplicity of openings 16 and 18 are arranged in a circle while in Figure 3 an annular opening 20 is formed.

Another arrangement is possible in which the gas annulus is permanently created by the gas forcing out in the vacuum space 8 from chamber 12 through the properly designed constricted openings. In still another arrangement the chamber 12 and coil 14, which may be a single turn coil, are made in the form of a section of a cone to apply a magnetic pressure component to the plasma in the chamber along the axis of the device towards space 8.

The details of the pulsed plasma x-ray source described herein, as well as the variations suggested thereof, are only illustrative and are not intended to limit the spirit or scope of the invention set forth in the appended claims.

We claim as our invention:

1. A method of producing repeatedly pulsed x-rays, comprising steps of:
   generating a plasma annulus in vacuum by way of electrical gas-discharge in a chamber having constricted openings;
   generating repeatedly pulsed x-rays by imploding and and pinching the said plasma annulus on its axis under the magnetic pressure created by passing high axial current through the said plasma annulus between two electrodes.

2. The method of producing repeatedly pulsed x-rays as defined in claim 1 further comprising:
   a step of withdrawing pulsed x-rays thus generated.

3. The method of producing repeatedly pulsed x-rays as defined in claim 2 wherein the step of generating the plasma annulus in vacuum comprises:
   a step of repeatedly causing electrical discharges in a gas contained in the chamber;
   the said chamber having a plurality of constricted openings arranged in a circle.

4. The method of producing repeatedly pulsed x-rays as defined in claim 3 wherein the step of repeatedly causing electrical discharges comprises:
   a step of repeatedly flowing electrical discharge currents through a coil wound about the chamber to cause repeated electrical discharges in the gas contained therein;
   the said discharges creating high temperature and pressure in the gas to force it through the openings.

5. The method of producing repeatedly pulsed x-rays as defined in claim 2, wherein the step of generating the plasma annulus in vacuum comprises:
   a step of repeatedly causing the electrical discharges in a gas contained in the chamber;
   the said chamber having an annular constricted opening.

6. The method of producing repeatedly pulsed x-rays as defined in claim 5, wherein the step of repeatedly causing electrical discharges comprises:
   a step of repeatedly flowing electrical discharge currents through a coil wound about the chamber to cause repeated electrical discharges in the gas contained therein;
   the said discharges creating high temperature and pressure in the gas to force it through the openings.

7. The method of producing repeatedly pulsed x-rays as defined in claim 4 wherein:
   the pulsed x-rays thus generated are withdrawn through passage means provided in at least one of the electrodes.

8. The method of producing repeatedly pulsed x-rays as defined in claim 6 wherein:
   the pulsed x-rays thus generated are withdrawn through passage means provided in at least one of the electrodes.

9. An apparatus for producing repeatedly pulsed x-rays comprising
   means for generating plasma annulus in vacuum by way of electrical gas-discharge in a chamber having constricted openings; and
   means for generating repeatedly pulsed x-rays by imploding and pinching the said plasma annulus on its axis under the magnetic pressure created by passing high axial current through the said plasma annulus between two electrodes.

10. The apparatus for producing repeatedly pulsed x-rays as defined in claim 9 further comprising:
    passage means for withdrawing said pulsed x-rays thus generated.

11. The apparatus for producing repeatedly pulsed x-rays as defined in claim 10 wherein the means for generating plasma annulus in vacuum comprise:
    electrical discharge means for repeatedly causing electrical discharges in a gas contained in the chamber; and
    the said chamber having a plurality of constricted openings arranged in a circle.

12. The apparatus for producing repeatedly pulsed x-rays as defined in claim 11 wherein:
    the electrical discharge means comprise:
    a discharge coil wound about the said chamber and through which electrical discharge currents are repeatedly passed to cause repeated electrical discharges in the gas contained therein.

13. The apparatus for producing repeatedly pulsed x-rays as defined in claim 10 wherein the means for generating plasma annulus in vacuum comprise:
    electrical discharge means for repeatedly causing electrical discharges in a gas contained in the chamber; and
    the said chamber having an annular constricted opening.

14. The apparatus for producing repeatedly pulsed x-rays as defined in claim 13, wherein:
    the electrical discharge means comprise:
    a discharge coil wound about the said chamber and through which electrical discharge currents are repeatedly passed to cause repeated electrical discharges in the gas contained therein.

15. The apparatus for producing repeatedly pulsed x-rays as defined in claim 12 wherein the said passage means are in the form of a hole provided in at least one of the electrodes.

16. The apparatus for producing repeatedly pulsed x-rays as defined in claim 14 wherein the said passage means are in the form of a hole provided in at least one of the electrodes.

* * * * *